United States Patent [19]

Nakayama

[11] 4,161,688
[45] Jul. 17, 1979

[54] CABLE FAULT LOCATING APPARATUS HAVING AN EARTH CURRENT CANCELLER

[75] Inventor: Tadaharu Nakayama, Tokyo, Japan

[73] Assignee: Sumitomo Electric Industries, Ltd., Osaka, Japan

[21] Appl. No.: 851,564

[22] Filed: Nov. 14, 1977

[30] Foreign Application Priority Data

Nov. 13, 1976 [JP] Japan .................. 51-137080
Jun. 27, 1977 [JP] Japan .................. 52-76410
Jul. 8, 1977 [JP] Japan .................. 52-81775
Aug. 25, 1977 [JP] Japan .................. 52-102011
Sep. 21, 1977 [JP] Japan .................. 52-113545

[51] Int. Cl.² .................................. G01R 31/08
[52] U.S. Cl. ..................................... 324/52
[58] Field of Search ........................ 324/51, 52

[56] References Cited

U.S. PATENT DOCUMENTS 3,800,216  3/1974  Hamilton .................. 324/52
3,812,420  5/1974  Gunter ...................... 324/52

Primary Examiner—Gerard R. Strecker
Attorney, Agent, or Firm—Sughrue, Rothwell, Mion, Zinn and Macpeak

[57] ABSTRACT

The cable fault locating apparatus employing an inverted Murray bridge circuit having a ratio arm connected to open ends of a faulty cable and a sound return cable, a voltage source connected through a switch to both ends of the ratio arm and a galvanometer connected between the output terminal of the ratio arm and the ground is characterized by an earth current canceller connected either in series or parallel with the galvanometer so as to cancel a stray earth current.

13 Claims, 12 Drawing Figures

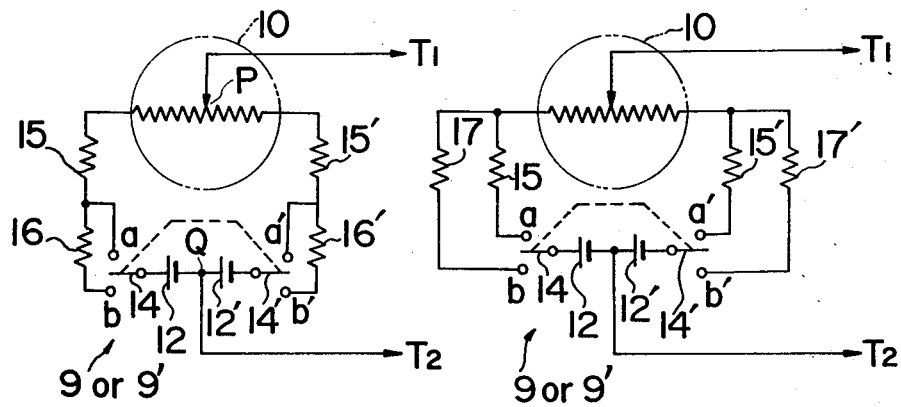
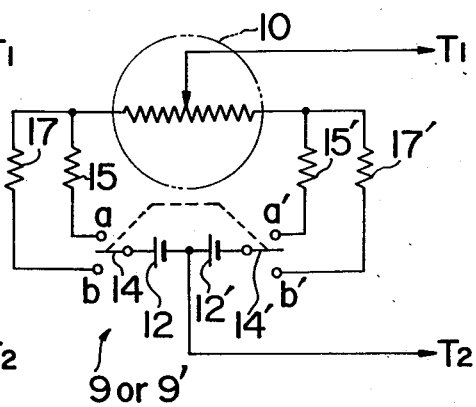
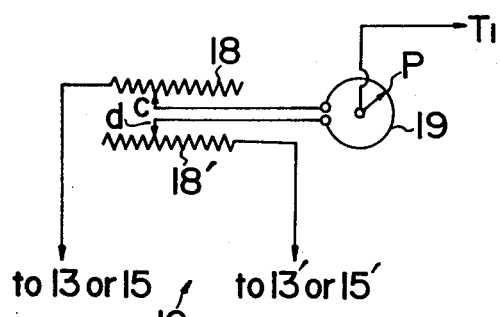
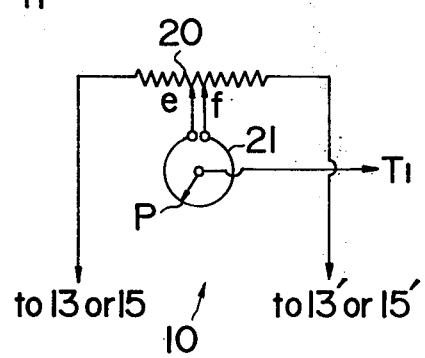
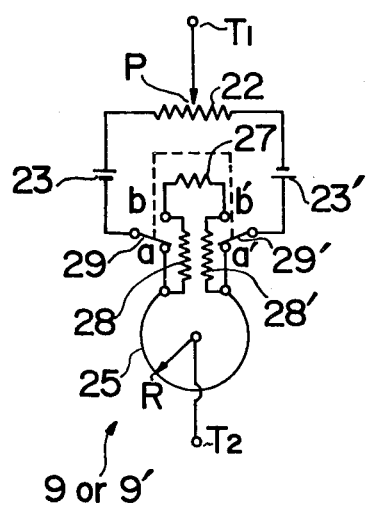
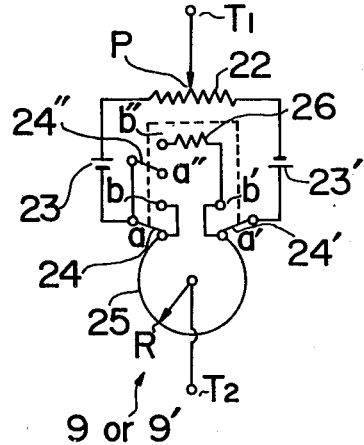

CABLE FAULT LOCATING APPARATUS HAVING AN EARTH CURRENT CANCELLER

BACKGROUND OF THE INVENTION

This invention relates to cable fault locating apparatuses, and more particularly to such an apparatus employing a bridge circuit.

A Murray bridge for locating a fault caused in a cable is well known in the art. In the Murray bridge, a loop circuit is formed by a faulty cable, the fault point to be located, a sound return cable, and a ratio arm connected between the two ends of the cables. A bridge source is connected between the output terminal of the ratio arm and the ground, and a galvanometer is connected between two terminals of the ratio arm.

In order to operate at high sensitivity with this Murray bridge type cable fault locating apparatus, it is necessary to provide an electrical source as high in voltage as several thousands of volts so as to supply necessary current to the bridge through the ground and the high resistance of the faulty point. Therefore, in the case of using the Murray bridge type cable faulty locating apparatus, before performing the bridge balancing operation thereof, it is necessary to carry out a so-called burnout operation in which the faulty point is burnt out by using another electric source, thereby decreasing the resistance of the faulty point, or the measurement is conducted with low sensitivity.

In order to overcome the above-described difficulty and to perform bridge work under the condition of high fault resistance with an appropriate sensitivity of galvanometer, a so-called inverted Murray bridge has been proposed which is obtained by replacing the position of the bridge source and the position of the galvanometer by each other in the aforementioned Murray bridge. In the inverted Murray bridge, it is possible to employ a low voltage source of the order of 1.5 to 2.0 volts and a galvanometer high in current sensitivity. Accordingly, the sensitivity of the inverted Murray bridge is, as a whole, much higher than that of the conventional Murray bridge. However, the inverted Murray bridge is still disadvantageous in that before initiating the bridge balancing operation, a stray earth current may be allowed to flow into the galvanometer, as a result of which the needle of the galvanometer is deflected out of the scale. It is therefore frequently impossible to carry out the detection of the faulty point with the apparatus employing the inverted Murray bridge. For this reason, the use of the inverted Murray bridge for locating a fault in a cable is impractical.

SUMMARY OF THE INVENTION

Accordingly, a general object of this invention is to provide an apparatus capable of locating a faulty point in a cable with the high sensitivity of a galvanometer and without a high voltage source.

Another object of the invention is to provide a cable fault locating apparatus which can be readily operated by any person.

A further object of the invention is to provide a cable fault locating apparatus in which a galvanometer can be effectively used over its entire sensitivity range, and the maximum value in resistance of a fault point which can be located can be increased.

The foregoing objects have been achieved according to the invention in which an earth current canceller is connected to the galvanometer in the above-described inverted bridge in such a manner as to cancel a stray earth current entering the galvanometer, thereby utilizing the advantages of the inverted bridge and eliminating the disadvantages of the same. The earth current canceller may be connected in series to the galvanometer so as to cancel an external stray electromotive force. Alternatively, the earth current canceller may be connected in parallel to the the galvanometer so as to provide current to cancel a stray earth current allowed to flow into the galvanometer by the external stray electromotive force.

In a first preferred embodiment, the earth current canceller comprises a DC source unit made up of two equal value DC voltage sources series-connected in forward polarity relation, a fine adjustment type potentiometer, and two electrical paths connecting both terminals of the DC source unit respectively to both terminals of the potentiometer. The two electrical paths are substantially equal in resistance, and means are provided for simultaneously changing the resistance of the two electrical paths while keeping the resistances of the two electrical paths equal at all times. The two output terminals of the earth current canceller are connected to the sliding contact of the potentiometer and the connection point between the two DC sources.

The second preferred embodiment of the earth current canceller comprises two DC sources having equal value DC voltages respectively connected to opposite terminals of a main potentiometer 22 in forward polarity relation. A sub potentiometer 25 is connected between the two DC sources via a ganged switch assembly consisting of two switches. This earth current canceller provides two output terminals, i.e., one is derived from the sliding contact P of the main potentiometer and the other from the sliding contact R of the sub potentiometer. The outside resistance value between the two terminals of the sub potentiometer 25 is changed when the ganged switch assembly is switched from the coarse adjustment position to a fine adjustment position.

BRIEF DESCRIPTION OF THE DRAWINGS

Additional objects as well as advantages of the invention will become more apparent from the following detailed description of the preferred embodiment thereof when read in conjunction with the accompanying drawings, in which:

FIGS. 5 through 7 are circuit diagrams illustrating various examples of the earth current canceller according to the first preferred embodiment and showing how resistors are inserted between a DC source unit and a potentiometer therein according to the invention;

FIGS. 8 and 9 are also circuits diagrams illustrating two examples of the potentiometer and showing how the potentiometer in the earth current canceller is the first preferred embodiment is embodied as a fine adjustment type potentiometer;

FIG. 10 shows the circuit diagram of the second preferred embodiment of the earth current canceller employed in the apparatus according to the invention; and FIG. 11 shows a modification of the circuit diagram shown in FIG. 10.

DETAILED DESCRIPTION OF THE PREFERRED EMBODIMENTS

Figure 1:
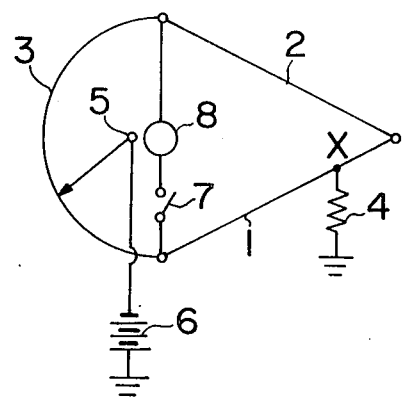
FIG. 1 shows a circuit diagram of the Murray bridge employed for locating a fault in a cable.
Figure 2:
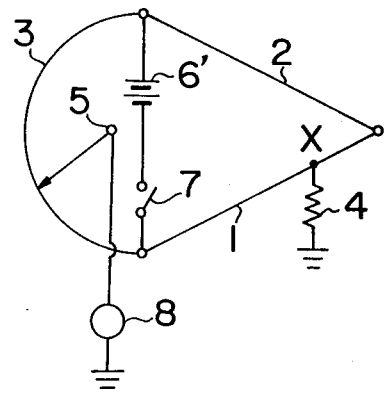
FIG. 2 is a circuit diagram of the inverted Murray bridge.

Shown in FIG. 1 is a Murray bridge which is extensively employed for locating a fault caused in a cable and is a typical example of the bridges of this type. In this bridge, a closed loop is formed by a faulty cable 1 having a faulty point X, a sound return cable 2, and a ratio arm 3. A bridge source 6 is connected between the output terminal 5 of the ratio arm 3 and the ground, while a galvanometer 8 is connected through a switch 7 between both ends of the ratio arm 3. Reference numeral 4 designates a faulty point resistance between the faulty cable's conductor and the ground or is cable shielding metal at the faulty point X. In order to operate the bridge at high sensitivity, it is necessary to supply DC current of the order of 20 to 100 mA from the source 6 through the ground or the shielding metal and through the faulty point resistance 4 to the bridge. In general, the faulty point resistance 4 is high. Therefore, the voltage of the source should be several thousands of volts or higher. This is not practical, of course. Accordingly, in locating the faulty point with this bridge, the faulty point is burnt out by using another electric source prior to the bridge balancing operation thereby to decrease the value of the faulty point resistance 4 as was described before, or the measurement is carried out with low sensitivity FIG. 2 shows a so-called inverted Murray bridge using a low voltage source, which has been proposed as a means which can locate a high fault resistance point with high accuracy. The bridge shown in FIG. 2 is different from the bridge in FIG. 1 in that the source 6 and the galvanometer 8 in FIG. 1 are replaced by a galvanometer 8 and a source 6' in FIG. 2, respectively. The source 6' employed in the bridge shown in FIG. 2 is frequently used under the condition that the output terminals thereto are almost short-circuited. Therefore, although a sufficient amount of current capacity is required for the source 6', the voltage required for it is on the order of 1.5 to 2.0 volts corresponding to a unit cell. Accordingly, with this bridge, no danger of electric shock is involved. Furthermore, because a galvanometer high in current sensitivity can be employed in the bridge, the sensitivity of the bridge is, as a whole, much higher than that of the conventional Murray bridge. However, in this inverted Murray bridge, before the bridge balancing operation is initiated by closing the switch 7, a stray earth current is allowed to flow in the galvanometer, as a result of which the needle of the galvanometer is deflected out of the scale. Therefore, it is completely impossible to continue the measurement, as was described before. The main reason for the flowing of the earth current is that moisture enters the faulty point thereby forming a local cell with the metallic part of the cable, the soil, and the grounding metallic material.

Figure 3A:
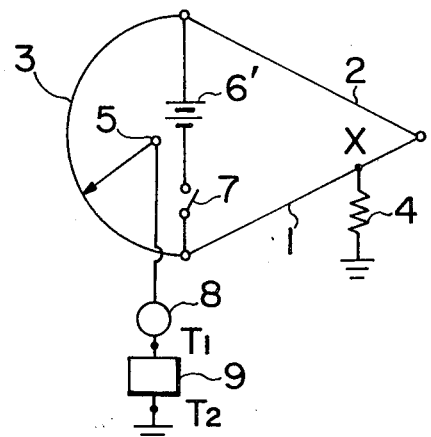
FIGS. 3(a) and 3(b) are circuit diagrams illustrating two examples of the cable fault locating apparatus according to the invention.
Figure 3B:
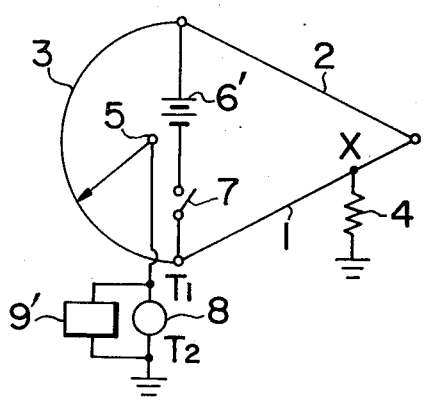

FIGS. 3(a) and 3(b) illustrate alternative connections for the earth current canceller in the cable fault locating apparatus according to this invention, the former (FIG. 3(a)) showing a case where an earth current canceller 9 is connected in series to a galvanometer 8, the latter (FIG. 3(b)) showing a case where an earth current canceller 9' is connected in parallel to a galvanometer 8. The construction of the earth current cancellers 9 and 9' will be described later with reference to FIGS. 4 through 11 in detail. In the series connection system shown in FIG. 3(a), a voltage which is equal in value but opposite in polarity to the voltage of a local cell provided at the faulty point or at a point in the circuit is obtained from the earth current canceller 9 so as to cancel the voltage of the local cell, so that the value of the current flowing in the galvanometer is maintained at zero or a value very close to zero. The order of connection of the galvanometer 8 and the earth current canceller 9 between the terminal 5 and the ground may be reversed. More specifically, the earth current canceller 9 may be connected through the galvanometer 8 to the ground. In the parallel connection system shown in FIG. 3(b), if a current which is equal in value but opposite in direction to the current allowed to flow in the galvanometer 8 owing to the presence of the local cell is obtained from the earth current canceller 9' so as to be applied to the galvanometer 8, the value of the current flowing in the galvanometer can be maintained at zero or a value very close to zero. In this case, the voltage necessary as the output of the earth current canceller is not equal to the voltage of the local cell, but it is equal to a value obtained by subtracting the voltage drop at the faulty point from the voltage of the local cell. Therefore, the resultant voltage is very low. While the current is zeroed in the galvanometer, the earth current in the other elements is maintained flowing.

Adjustment of the earth current canceller is carried out as follows: First of all, the switch 7 is kept open. Then, the ganged switches of the earth current canceller are closed. Thereafter, position of the sliding contact of the potentiometer in the earth current canceller is suitably adjusted.

In either of the systems shown in FIGS. 3(a) and 3(b), if the switch 7 is closed to start the bridge balancing operation after the earth current canceller is adjusted, a current corresponding to the unbalanced condition of the bridge is allowed to flow in the galvanometer, and the needle of the galvanometer which has rested at zero or near zero is therefore deflected in the positive or negative direction. Therefore, the ratio arm is adjusted so that the needle is set to zero, and then the balance point is read to locate the faculty point X similarly as in the case of the conventional bridge.

The circuit of the earth current canceller 9 employed in series is identical with that of the earth current canceller 9' employed in parallel. However, the former 9 is different from the latter 9' in the values of the components.

Figure 4:
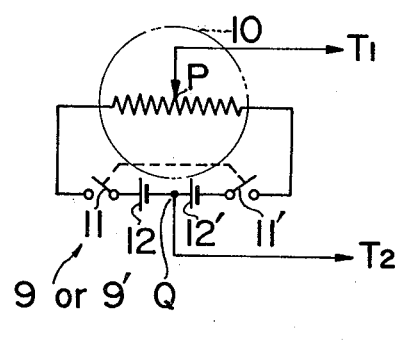
FIG. 4 shows a fundamental circuit diagram of the first preferred embodiment of the earth current canceller employed in the apparatus according to the invention.

As shown in FIG. 4, the fundamental circuit of the earth current canceller 9 and 9' of the first preferred embodiment comprises: a potentiometer 10 having a fine adjustment function as described later; a DC source unit obtained by connecting two equal DC sources 12 and 12' in forward polarity relation, which are two unit batteries equal in voltage or two series-connected battery groups also equal in voltage; a ganged switch assembly consisting of two switches 11 and 11' which connect both terminals of the DC source unit to both terminals of the potentiometer 10, respectively; and two output terminals T1 and T2 which are connected to the sliding contact P of the potentiometer 10 and the connection point Q of the DC sources 12 and 12'. Either of the two output terminals T1 and T2 can be connected to the galvanometer regardless of the polarity thereof, because voltage or current can be obtained from the earth current canceller regardless of the polarity thereof. More specifically, if the sliding contact P is set at the middle point of the potentiometer 10, the potential difference between the points P and Q is zero; however, if the sliding contact P is moved leftward as viewed in FIG. 4, a positive potential with respect to the potential of the connection point Q is obtained at the sliding contact P, as a result of which a current flowing from the sliding contact P to the connection point Q is obtained. In contrast, if the sliding contact P is moved rightward as viewed in FIG. 4, a negative potential with respect to the potential of the connection point Q is obtained at the sliding contact P, as a result of which a current flowing from the connection point Q to the sliding contact P can be obtained.

In the fundamental circuit shown in FIG. 4, when the sliding contact P is moved to either end of the potentiometer, the positive or negative voltages equal to the voltages of the sources 12 and 12' can be obtained, respectively. However, since the local cell provided at the faulty point is, in general, low in voltage, it is unnecessary to move the sliding contact P to the ends of the potentiometer.

The adjustment of the earth current canceller is carried out as follows: The ganged switches 11 and 11' are closed with the switch 7 in the circuit shown in FIG. 3(a) or 3(b) kept open, and then the sliding contact P is slid until the needle of the galvanometer 8 rests at zero at the center in the scale. However, it should be noted that this adjustment of the earth current canceller is considerably difficult. More specifically, even if the sliding contact P is slightly moved, the pointer of the galvanometer is deflected greatly rightward or leftward. This is so especially when the resistance of the faulty point is high and the galvanometer is used at high sensitivity.

In this invention, resistors are connected between the terminals of the potentiometer 10 and the terminals of the DC source unit 12 and 12', respectively, and the potentiometer 10 itself is so designed as to have a fine adjustment function. Thus, the earth current canceller, having two fine adjustment functions, can be readily manipulated by anyone.

Figure 5:
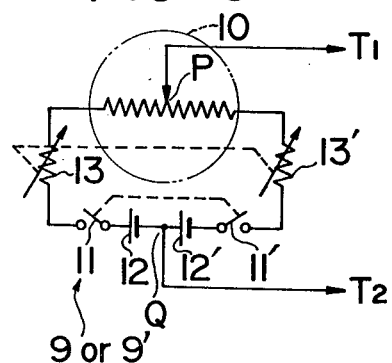

FIGS. 5 to 7 show three different modifications of the first preferred embodiment of the earth current canceller in which, according to the invention, resistors are connected between the potentiometer and the DC source unit. FIG. 5 shows an arrangement in which a ganged variable resistor assembly consisting of two identical variable resistors 13 and 13' is employed. In the circuit shown in FIG. 6, resistors 15 and 15' whose resistances are equal but relatively low are respectively series-connected to resistors 16 and 16' whose resistances are equal but relatively high, and a ganged switch assembly consisting of switches 14 and 14' is provided in such a manner that the knife blade of the switch 14 is moved between the terminals a and b connected on either side of the resistor 16, while the blade of the switch 14' is moved between the terminals a' and b' connected on either side of the resistor 16' so that the resistors 15 and 15' or the series resistances 15 and 16, and 15' and 16' are inserted in the circuit. In the circuit shown in FIG. 7, resistors 15 and 15' whose resistances are equal but relatively low are respectively parallel-connected to resistors 17 and 17' whose resistances are equal but relatively high, and a ganged switch assembly consisting of switches 14 and 14' is provided in such a manner that the blade of the switch 14 is moved between the terminals a and b connected to the resistors 15 and 17, respectively, while the blade of the switch 14' is moved between the terminals a' and b' connected to the resistors 15' and 17', respectively, so that the resistors 15 and 15' or the resistors 17 and 17' are inserted in the circuit.

In any of the circuits shown in FIGS. 5 to 7, the resistances inserted between the DC source unit 12 and 12' and the potentiometer 10 are selected to be low in value at the beginning of the adjustment so as to adjust the galvanometer at low sensitivity. Then, the low resistances are increased or switched over to the high resistances while the sensitivity of the galvanometer is being increased, thereby carring out the adjustment.

In the circuits shown in FIGS. 5 to 7, if the maximum resistance values of the resistors 13 and 13', the resistance values of the resistors 16 and 16', or the resistance values of the resistors 17 and 17' are excessively high, then the value of a current circulating in the closed loop circuit is decreased and the internal resistance is increased, as a result of which the output currents obtained through the terminals $T_1$ and $T_2$ are decreased and the cancellation performance of the earth current canceller is lowered. Accordingly, this difficulty is overcome by giving a fine adjustment function to the potentiometer 10 according to the invention.

FIGS. 8 and 9 illustrate two examples providing the fine adjustment function to the potentiometer 10. In FIG. 8, the potentiometer 10 is made up of two ganged variable resistors 18 and 18', and an auxiliary potentiometer 19 which is connected between the sliding contacts c and d of the two variable resistors 18 and 18'. The sliding contacts c and d are slid in such a manner that they are confronted with each other at all times. The sliding contact P of the auxiliary potentiometer 19 is connected to the output terminal T1 of the earth current canceller. In FIG. 9, the potentiometer is made up of a main potentiometer 20 having two sliding contacts e and f which are slid keeping a predetermined distance therebetween, and an auxiliary potentiometer 21 connected between the two sliding contacts e and f of the main potentiometer 20. The sliding contact P of the auxiliary potentiometer 21 is connected to the output terminal T1 of the earth current canceller. A potentiometer with a purely mechanical fine adjustment mechanism in which the position of the sliding contact is mechanically finely adjusted for instance, may be employed instead of the above-described potentiometers with electrical and mechanical fine adjustment mechanisms.

According to the arrangement of the earth current canceller in which the resistances between the DC source unit 12 and 12' and the potentiometer are increased and the potentiometer is of the fine adjustment type, because of the multiplication effects, the stray earth current flowing in the galvanometer can be readily set to zero or a value near zero. For instance if the fine adjustment function is increased ten (10) times by increasing the inserted resistance and the fine adjustment function is further increased ten (10) times by employing the potentiometer of the fine adjustment type, the fine adjustment function is increased a hundred (100) times by the multiplication thereof.

In the circuits shown in FIGS. 6 and 7, the two resistors are employed to provide each of the electrical paths between the terminals of the DC source unit and the terminals of the potentiometer. However, the electrical path may be formed with three resistors whose values are increasingly different. In this case, the adjustment can be carried out by succeedingly switching the lower resistor to the higher resistor which the switch and by gradually increasing the sensitivity of the galvanometer. Furthermore, the order of connection of the switches and the resistors between the DC source unit and the potentiometer may be opposite to that shown in the figures.

The second preferred embodiment of the earth current canceller 9 and 9' will now be described with reference to FIG. 10. The circuit of the earth current canceller 9 employed in series is identical with that of the earth current canceller 9' employed in parallel, however, the former 9 is different from the latter 9' in the values of the component, as in the first preferred embodiment thereof. Further, either of the two output terminals $T_1$ and $T_2$ can be connected to the galvanometer regardless of the polarity thereof, as in the first preferred embodiment thereof. As shown in FIG. 10, the sliding contact P of the main potentiometer 22 is one of the outputs of the earth current canceller. Three ganged switches 24, 24' and 24" provide two ON positions and one OFF position (not shown). More specifically, one of the ON position is coarse adjustment position a, a' and a" and the other thereof is a fine adjustment position b, b' and b", respectively. Since it is short-circuited between the coarse adjustment position and the fine adjustment position a-b and a'-b', there is no variation in either the coarse adjustment position or the fine adjustment position as to the fact that the sub potentiometer 25 is directly inserted between the switches 24 and 24'. However, a fixed resistor 26 is connected between b' and b" of the fine adjustment position, so that the fixed resistor 26 is connected in parallel to the sub potentiometer 25 by the operation of the switch 24" so as to contact with the point b" only when the switch 24' is in the fine adjustment position. DC sources 23 and 23' having equal voltage values are inserted between one end of the main potentiometer 22 and the switches 24 and 24" and between the other end of the main potentiometer 22 and the switch 24', respectively, as shown in FIG. 10. Resistors may be further inserted therebetween in addition to the DC sources. The sliding contact R of the sub potentiometer is the outer output terminal $T_2$ of the earth current canceller. The value of the sub potentiometer 25 is one or two order of magnitude less than the value of the main potentiometer 22. In order to simplify the description, assuming that the external resistance viewed from the output terminals $T_1$ and $T_2$ is infinity, the current flowing in the loop circuit due to the DC sources hardly changes regardless of the coarse adjustment position or the fine adjustment position of the switches. However, the resistance value between the switch positions is lowered in the fine adjustment position, so that the voltage drop is accordingly lowered in proportion thereto. More specifically, though the fine adjustment mechanism is provided even in the coarse adjustment position by driving the sub potentiometer, an easier fine adjustment mechanism is obtained by setting the switch in the fine adjustment position. Furthermore, even in the fine adjustment position, the voltage and current characteristics capable of cancellation are not lowered, and thus the DC source voltage value can be sufficiently utilized.

FIG. 11 is a modification of the circuit shown in FIG. 10, in which the sliding terminal P of the main potentiometer 22 is one of the output terminals $T_1$ and two ganged switches 29 and 29' provide two ON positions, one a, a' for the coarse adjustment position and b, b' for the fine adjustment position, and also an OFF position (not shown). A fixed resistor 27 is connected between the fine adjustment positions b, b' and the sub potentiometer 25 is connected between the coarse adjustment positions a, a'. Between the coarse adjustment position and the fine adjustment position, i.e., between a and b and between a' and b', fixed resistors 28 and 28' having equal resistance values are connected, respectively. DC sources 23 and 23' having equal voltage values are separately connected between the main potentiometer 22 and the switches 29 and 29', respectivly. The sliding terminal R of the sub potentiometer 25 is the other output terminal $T_2$ of the canceller. Fixed resistors may be inserted between the main potentiometer 22 and the switches 29 and 29'in addition to the DC sources. The value of the sub potentiometer 25 is one or two orders of magnitude less than the value of the main potentiometer 22. Further, the value of fixed resistor 27 may be made equal to that of the sub potentiometer 25. The value of the fixed resistors 28 and 28' is one order of magnitude higher than the value of the fixed resistor 27. In order to simplify the description, assuming that the external resistance viewed from the output terminals $T_1$ and $T_2$ is infinity, the current flowing from the DC sources inside the loop circuit does not change regardless of the switch position in either the coarse adjustment position or the fine adjustment position. (This is the case when the value of the fixed resistor 27 is equal to that of the sub potentiometer 25.) More specifically, even in the coarse adjustment position, the fine adjustment mechanism is effected by manipulating the sub potentiometer. However, when the switch is set in the fine adjustment position, the fixed resistors 28 and 28' are to be connected to the two terminals of the sub potentiometer 25, respectively, and the fixed resistor 27 is to be connected in parallel to the sub potentiometer 25 plus the fixed resistors 28 and 28'. This means that the voltage drop in the sub potentiometer 25 becomes smaller, that is, an easier fine adjustment mechanism is provided. Furthermore, when the switch is in the fine adjustment position, the internal resistance of the circuit does not largely change and the equal loop current is maintained as in the coarse adjustment position, whereby the cancelling voltage or the cancelling current is not lowered.

As is apparent from the above description, this invention provides a cable fault locating apparatus in which the advantages of the inverted bridge is utilized but the disadvantages thereof are eliminated, whereby the bridge source of low voltage can be used, and the bridge balancing operation can be carried out with the galvanometer set at high sensitivity, and in addition the operation can be effected by anyone.

While a few examples of preferred embodiments of the invention have been illustrated and described in detail, it is particularly to be understood that the invention is not limited thereto or thereby, and various changes and modifications may be made therein without departing from the invention. For instance, the invention has been realized with the inverted Murray bridge; however, it is obvious that the invention can be realized with an inverted Varley bridge or other various types of bridges obtained by modifying the inverted Murray bridge or the inverted Varley bridge.

What is claimed is:

1. In a cable fault locating apparatus of the type which comprises a bridge circuit made up of a ratio arm having a movable tap output terminal and connected to open ends of a faulty cable and a sound return cable which are connected to form a loop circuit, a bridge power source connected through a switch to both ends of said ratio arm for providing electrical power to said bridge circuit, and a galvanometer connected between the output terminal of said ratio arm and the ground, the improvement comprising an earth current canceller means having first and second output terminals and connected to said galvanometer so as to cancel a stray earth current which may be produced by moisture or the like entering the faulty point to thereby form a local cell with the metallic part of the faulty cable, the soil, and the grounding metallic material.

2. An apparatus as claimed in claim 1, wherein said earth current canceller means is connected in series with said galvanometer.

3. An apparatus as claimed in claim 1, wherein said earth current canceller means is connected in parallel with said galvanometer.

4. An apparatus as claimed in claim 1, wherein said earth current canceller means comprises:
 a DC source unit made up of two DC sources series-connected in forward polarity relation, said two DC sources being equal in voltage;
 a fine adjustment type potentiometer means;
 two electrical path connecting the terminals of said DC source unit respectively to the terminals of said potentiometer means, said two electrical paths being substantially equal in resistance;
 means for simultaneously changing the resistances of said two electrical paths while keeping the resistances of said two electrical paths equal at all times; and said first and second output terminals one of which is connected to the sliding contact of said potentiometer means and the other of which is connected to the connection point between said two DC sources.

5. An apparatus as claimed in claim 4, wherein each of said two electrical paths in said earth current canceller means includes a switch and a variable resistor which are connected in series with each other, the switch in one of the electrical paths and the switch in the other electrical path being in the form of a ganged switch assembly, the variable resistor of said one electrical path and the variable resistor of said other electrical path being in the form of a ganged variable resistor assembly.

6. An apparatus as claimed in claim 4, wherein each of said two electrical paths in said earth current canceller means includes a first resistance path relatively low in resistance, a second resistance path relatively high in resistance, and a switch, and said switch of said one electrical path and said switch of said other electrical path are in the form of a ganged switch assembly, said ganged switch assembly operating to connect a selected one of said first and second resistance path between a respective terminal of said DC source unit and the terminal of said selected resistance path in each of the electrical paths.

7. Apparatus as claimed in claim 6, wherein in each of said electrical paths of said earth current canceller means, said first resistance path comprises a branch path including a resistor relatively low in resistance, and second resistance path comprises a branch path including said resistor relatively low in resistance and a resistor relatively high in resistance and connected in series with said resistor relatively low in resistance in the first resistance path.

8. An apparatus as claimed in claim 6, wherein in each of said electrical path in said earth current canceller means, said first resistance path comprises a branch path including a resistor relatively low in resistance, and said second resistance path comprises a branch path including a resistor relatively high in resistance.

9. An apparatus as claimed in claim 4, wherein said fine adjustment type potentiometer means in said earth current canceller means comprises first and second variable resistors ganged, and an auxiliary potentiometer connected between the sliding contacts of said first and second variable resistors, said sliding contacts being slid confronting each other, one terminal of said first variable resistor and one terminal of said second variable resistor which is opposite to the terminal of said second variable resistor confronting said one terminal of said first variable resistor are employed as the terminals of said fine adjustment type potentiometer, and one output terminal of said earth current canceller means is connected to the sliding contact of said auxiliary potentiometer.

10. An apparatus as claimed in claim 4, wherein said fine adjustment type potentiometer means in said earth current canceller comprises a potentiometer having two sliding contacts which are slid keeping a predetermined short distance therebetween, and an auxiliary potentiometer is connected between said two sliding contacts, and one output terminal of said earth current canceller means is connected to the sliding contact of said auxiliary potentiometer.

11. An apparatus as claimed in claim 4, wherein said fine adjustment type potentiometer means in said earth current canceller means has a purely mechanical fine adjustment mechanism for finely adjusting the position of the sliding contact of said earth current canceller means.

12. An apparatus as claimed in claim 1, wherein said earth current canceller means comprises:
 a first potentiometer means having a sliding contact and two terminals;
 two DC sources respectively connected to said two terminals of said first potentiometer means in forward polarity relation, said two DC sources being equal in voltage;
 a switch means connected to said two DC sources and selectable between either a coarse adjustment position or a fine adjustment position;
 a second potentiometer means having a sliding contat and two terminals, said two terminals of said second potentiometer means being connected between said two DC sources via said switch means;
 said first and second output terminals, one being derived from said sliding contact of said first potentiometer means and the other from said sliding contact of said second potentiometer means; and
 a fixed resistor means connected in parallel to said second potentiometer means when said switch means is switched from the coarse adjustment position to the fine adjustment position.

13. An apparatus as claimed in claim 12, further comprising a second means having a fixed resistance, said second resistor means being connected in parallel to said second potentiometer means when said switch means is in the coarse adjustment position, and predetermined portions of said resistance of said second resistor means being connected in series with said two terminals of said second potentiometer means, respectively when said switch means is switched from the coarse adjustment position to the fine adjustment position.

* * * * *